United States Patent [19]
Kim

[11] Patent Number: 6,014,553
[45] Date of Patent: Jan. 11, 2000

[54] AUTOMATIC GAIN CONTROL CIRCUIT FOR SATELLITE COMMUNICATION TRANSMITTERS

[75] Inventor: Nam Gu Kim, Busan, Rep. of Korea

[73] Assignee: Hyundai Electronics Industries Co., Ltd., Rep. of Korea

[21] Appl. No.: 08/533,782

[22] Filed: Sep. 26, 1995

[30] Foreign Application Priority Data

Dec. 30, 1994 [KR] Rep. of Korea ............... 94-39855

[51] Int. Cl.[7] ..................................... H04B 1/04
[52] U.S. Cl. .................. 455/126; 455/12.1; 330/278; 330/289
[58] Field of Search .................. 455/3.3, 3.2, 7, 455/11.1, 12.1, 13.4, 126, 115, 103, 127, 427; 330/127, 129, 278, 284, 289

[56] References Cited

U.S. PATENT DOCUMENTS

| | | | |
|---|---|---|---|
| 5,081,713 | 1/1992 | Miyazaki | 455/115 |
| 5,193,223 | 3/1993 | Walczak et al. | 455/126 |
| 5,345,591 | 9/1994 | Tsurumaki et al. | 455/3.2 |
| 5,410,729 | 4/1995 | Kumagai et al. | 455/126 |
| 5,416,441 | 5/1995 | Nagano | 455/126 |
| 5,511,234 | 4/1996 | Ha | 455/126 |
| 5,724,645 | 3/1998 | Na | 455/3.2 |

FOREIGN PATENT DOCUMENTS 3-101526  4/1991  Rep. of Korea .

*Primary Examiner*—Doris H. To
*Attorney, Agent, or Firm*—Blank Rome Comisky & McCauley LLP

[57] ABSTRACT

An automatic gain control circuit for a satellite communication transmitter, comprising a gain amplification circuit for amplifying an intermediate frequency signal from an output terminal of a modulator in the satellite communication transmitter, a distributor for distributing the amplified intermediate frequency signal from the gain amplification circuit, an intermediate frequency signal detector for detecting the intermediate frequency signal distributed by the distributor, a reference signal detector for detecting a reference signal from an indoor system controller, the reference signal being used to control a level of the intermediate frequency signal distributed by the distributor, and a differential integrator for offsetting variations in an output signal from the intermediate frequency signal detector and in an output signal from the reference signal detector based on external temperature variations with respect to each other and feeding the resultant signal back to the gain amplification circuit.

5 Claims, 2 Drawing Sheets

AUTOMATIC GAIN CONTROL CIRCUIT FOR SATELLITE COMMUNICATION TRANSMITTERS

BACKGROUND OF THE INVENTION

1. Field of the Invention

The present invention relates in general to compensation for the temperature of an automatic gain control circuit used in outdoor satellite communication transmitters, and more particularly to a technique for minimizing variations in an output intermediate frequency signal from the automatic gain control circuit based on external temperature variations.

2. Description of the Prior Art

Various methods have conventionally been proposed to compensate for the temperature of an automatic gain control circuit for satellite communication transmitters used in outdoor equipment. One such conventional temperature compensation method is to offset variations in an output signal from an intermediate frequency signal detector and in an output signal from a reference signal detector based on external temperature variations with respect to each other using a differential integrator. The intermediate frequency signal detector is adapted to detect an output intermediate frequency signal from the automatic gain control circuit and the reference signal detector is adapted to detect a reference signal. Another conventional temperature compensation method is to maintain the internal temperature of the outdoor equipment at a normal temperature using a heater. However, the first conventional temperature compensation method has a disadvantage in that the output intermediate frequency signal from the automatic gain control circuit has a bad temperature characteristic (±2 dB or more) based on the external temperature variation (−30° C.−+50° C.). The second conventional temperature compensation method has a disadvantage of increasing consumption power and cost.

On the other hand, a satellite channel monitoring system is disclosed in Japanese Patent Publication No. Heisei 3-101526. The satellite channel monitoring system is adapted to monitor states of satellite channels of self and counterpart stations to readily manage the satellite channels in a satellite communication ground station for communicating with a satellite, more particularly in a satellite communication ground station with no control means for maintaining a satellite output constant. To this end, the satellite channel monitoring system comprises logic means for receiving a self-station transmit signal from the satellite and calculating an attenuation level of a down link from the satellite to the self-station according to the received level. The logic means also receives a transmit signal from the counterpart station and calculates an attenuation level of an up link from the satellite to the counterpart station on the basis of the received level and the calculated attenuation level of the down link from the satellite to the self-station. However, the above-mentioned satellite channel monitoring system does not relate to a technique proposed by the present invention and cannot solve the above conventional problems.

SUMMARY OF THE INVENTION

Therefore, the present invention has been made in view of the above problems, and it is an object of the present invention to provide an automatic gain control circuit for satellite communication transmitters which is capable of minimizing variations in an output intermediate frequency signal based on external temperature variations.

In accordance with the present invention, the above and other objects can be accomplished by a provision of an automatic gain control circuit for a satellite communication transmitter, comprising gain amplification means for amplifying an intermediate frequency signal from an output terminal of a modulator in the satellite communication transmitter; distribution means for distributing the amplified intermediate frequency signal from the gain amplification means; intermediate frequency signal detection means for detecting the intermediate frequency signal distributed by the distribution means; reference signal detection means for detecting a reference signal from an indoor system controller, the reference signal being used to control a level of the intermediate frequency signal distributed by the distribution means; and differential integration means for offsetting variations in an output signal from the intermediate frequency signal detection means and in an output signal from the reference signal detection means based on external temperature variations with respect to each other and feeding the resultant signal back to the gain amplification means.

The intermediate frequency signal detection means and the reference signal detection means include Schottky diodes, respectively. The Schottky diodes have the same temperature characteristic to constantly maintain a level of the output signal from the intermediate frequency signal detection means and a level of the output signal from the reference signal detection means regardless of the external temperature variations.

Each of the intermediate frequency signal detection means and the reference signal detection means also includes a thermistor integrated with the Schottky diode, for maintaining the temperature of the Schottky diode constant, and a mechanical device for insulating the thermistor from the outside.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
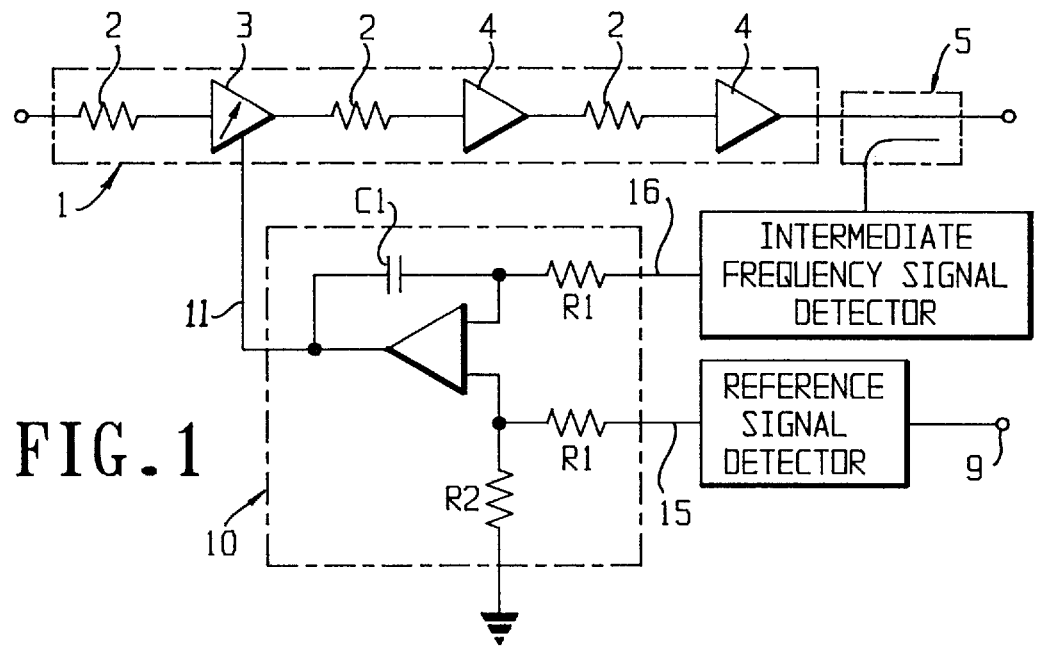
FIG. 1 is a schematic view illustrating a construction of an automatic gain control circuit for a satellite communication transmitter in accordance with the present invention.

Referring to FIG. 1, there is schematically shown a construction of an automatic gain control circuit for a satellite communication transmitter in accordance with the present invention. As shown in this drawing, the automatic gain control circuit comprises a gain amplification circuit 1 for amplifying an intermediate frequency signal from an output terminal of a modulator in the satellite communication transmitter, and a distributor 5 for distributing the amplified intermediate frequency signal 6 from the gain amplification circuit 1 to an intermediate frequency signal detector 7 and a frequency controller (not shown).

The intermediate frequency signal detector 7 is adapted to detect the intermediate frequency signal 6 distributed by the distributor 5 and output the detected intermediate frequency signal to a differential integrator 10.

The automatic gain control circuit further comprises a reference signal detector 8 for detecting a reference signal 9 from an indoor system controller (not shown) and outputting the detected reference signal to the differential integrator 10. The reference signal 9 from the indoor system controller is used to control a level of the intermediate frequency signal 6 distributed by the distributor 5.

The differential integrator 10 is adapted to offset variations in an output signal 16 from the intermediate frequency signal detector 7 and in an output signal 15 from the reference signal detector 8 based on external temperature variations with respect to each other and feed the resultant signal back to the gain amplification circuit 1.

The gain amplification circuit 1 includes one variable gain amplifier 3, two fixed gain amplifiers 4 and three fixed attenuators 2. The first fixed attenuator 2 is connected between the output terminal of the modulator in the satellite communication transmitter and the variable gain amplifier 3. The second fixed attenuator 2 is connected between the variable gain amplifier 3 and the first fixed gain amplifier 4. The third fixed attenuator 2 is connected between the first and second fixed gain amplifiers 4.

The differential integrator 10 is well-known in the art and details thereof will thus be omitted.

The operation of the automatic gain control circuit for the satellite communication transmitter with the above-mentioned construction in accordance with the present invention will hereinafter be described in detail.

In the gain amplification circuit 1, the intermediate frequency signal from the output terminal of the modulator in the satellite communication transmitter is transferred to the variable gain amplifier 3 through the first fixed attenuator 2 which functions to prevent a saturation state of the variable gain amplifier 3. The variable gain amplifier 3 amplifies the intermediate frequency signal transferred through the first fixed attenuator 2 and transfers the resultant intermediate frequency signal 6 to the distributor 5 through the second and third fixed attenuators 2 and the first and second fixed gain amplifiers 4. The distributor 5 distributes the amplified intermediate frequency signal 6 from the gain amplification circuit 1 to the intermediate frequency signal detector 7 and the frequency controller. The reference signal detector 8 detects the reference signal 9 from the indoor system controller and outputs the detected reference signal to the differential integrator 10. The intermediate frequency signal detector 7 detects the intermediate frequency signal 6 distributed by the distributor 5 and outputs the detected intermediate frequency signal to the differential integrator 10. The differential integrator 10 compares the output signal 16 from the intermediate frequency signal detector 7 with the output signal 15 from the reference signal detector 8. Then, the differential integrator 10 generates a control signal 11 corresponding to a difference as a result of the comparison and outputs the generated control signal 11 to the variable gain amplifier 3 in the gain amplification circuit 1 to control a gain of the variable gain amplifier 3.

Figure 2:
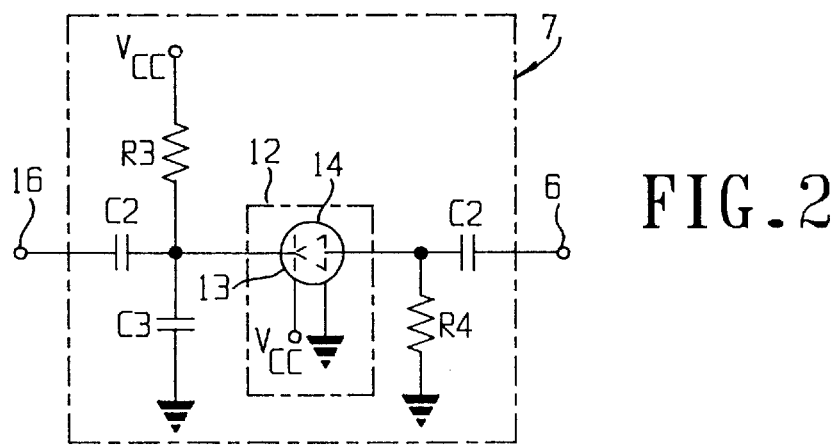
FIG. 2 is a detailed circuit diagram of an intermediate frequency signal detector in FIG. 1.
Figure 3:
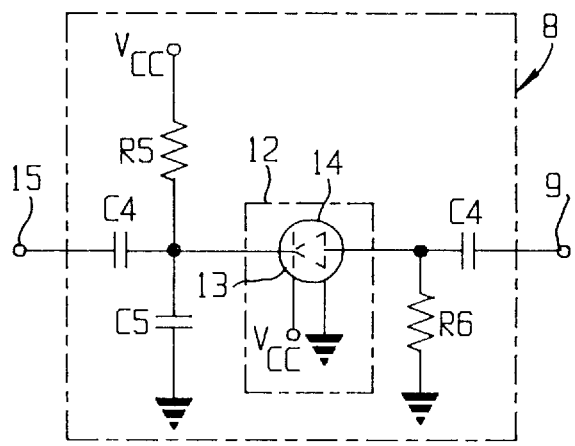
FIG. 3 is a detailed circuit diagram of a reference signal detector in FIG. 1.

FIGS. 2 and 3 are detailed circuit diagrams of the intermediate frequency signal detector 7 and the reference signal detector 8 which receive the intermediate frequency signal 6 from the distributor 5 and the reference signal 9 from the indoor system controller, respectively. As shown in these drawings, the intermediate frequency signal detector 7 and the reference signal detector 8 include Schottky diodes 13, respectively. The Schottky diodes 13 have the same temperature characteristic to constantly maintain a level of the output signal 16 from the intermediate frequency signal detector 7 and a level of the output signal 15 from the reference signal detector 8 regardless of the external temperature variations. Each of the intermediate frequency signal detector 7 and the reference signal detector 8 also includes a thermistor 14 integrated with the Schottky diode 13, for maintaining the temperature of the Schottky diode 13 constant, a mechanical device 12 for minimizing temperature variations of the integrated thermistor 14 and Schottky diode 13, and a power source Vcc for supplying power to the thermistor 14.

As previously stated with reference to FIG. 1, the differential integrator 10 receives the output signal 16 from the intermediate frequency signal detector 7 and the output signal 15 from the reference signal detector 8. At this time, the output signal 16 from the intermediate frequency signal detector 7 and the output signal 15 from the reference signal detector 8 may not be constant in level due to the external temperature variations. For this reason, according to the present invention, the Schottky diodes 13 have the same temperature characteristic to constantly maintain the level of the output signal 16 from the intermediate frequency signal detector 7 and the level of the output signal 15 from the reference signal detector 8 regardless of the external temperature variations. With the Schottky diodes 13 employed, the differential integrator 10 offsets the variations in the output signal 16 from the intermediate frequency signal detector 7 and in the output signal 15 from the reference signal detector 8 based on the external temperature variations with respect to each other.

On the other hand, the intermediate frequency signal 6 from the distributor 5 has a large variation based on the external temperature variation, whereas the reference signal 9 from the indoor system controller has a small variation based on the external temperature variation. The mechanical devices 12 are used to minimize such variations in the intermediate frequency signal 6 from the distributor 5 and the reference signal 9 from the indoor system controller based on the external temperature variation.

Figure 4:
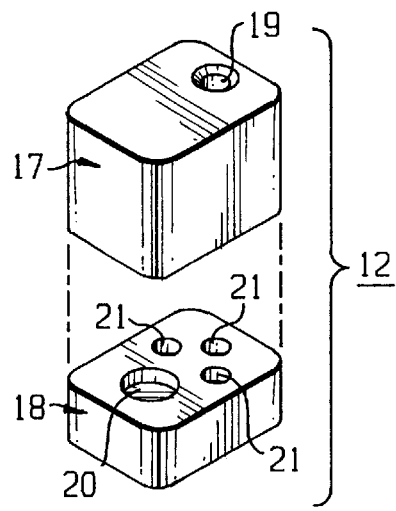
FIG. 4 is an exploded perspective view of each mechanical device in FIGS. 2 and 3.
Figure 5:
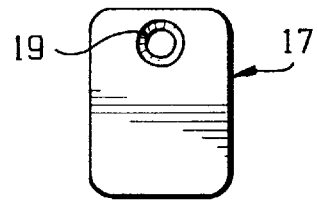
FIG. 5 is a top view of an upper part of the mechanical device in FIG. 4.
Figure 6:
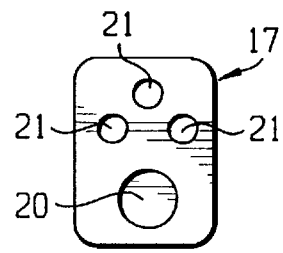
FIG. 6 is a bottom view of the upper part of the mechanical device in FIG. 4.
Figure 7:
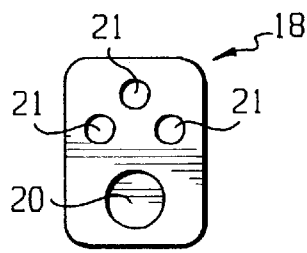
FIG. 7 is a top view of a lower part of the mechanical device in FIG. 4.
Figure 8:
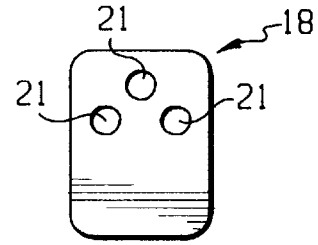
FIG. 8 is a bottom view of the lower part of the mechanical device in FIG. 4.

FIG. 4 is an exploded perspective view of each of the mechanical devices 12 in FIGS. 2 and 3. As shown in this drawing, each of the mechanical devices 12 includes upper and lower parts 17 and 18. The upper part 17 of the mechanical device 12 has a top portion as shown in FIG. 5 and a bottom portion as shown in FIG. 6. The lower part 18 of the mechanical device 12 has a top portion as shown in FIG. 7 and a bottom portion as shown in FIG. 8.

In accordance with the preferred embodiment of the present invention, the thermistor 14 is enclosed by the upper and lower parts 17 and 18 of the mechanical device 12 under the condition that it is mounted on a printed circuit board (PCB). The upper and lower parts 17 and 18 of the mechanical device 12 have their thermistor recesses 20 formed at portions corresponding to the thermistor 14. The upper part 17 of the mechanical device 12 also has a screw hole 19 for assembling the upper and lower parts 17 and 18. Further, each of the upper and lower parts 17 and 18 of the mechanical device 12 has a plurality of screw holes 21 for assembling the upper and lower parts 17 and 18.

The thermistor 14 is attached to the top surface of the Schottky diode 13 using a bond with a high thermal conductivity and a hot adhesiveness. In order to insulate the thermistor 14 from the outside, the thermistor recesses 20 of the upper and lower parts 17 and 18 of the mechanical device 12 are filled with glass fiber. Then, the upper and lower parts 17 and 18 of the mechanical device 12 are screwed to the top and bottom surfaces of the printed circuit board through the screw holes 19 and 21. As a result, because the temperature variations in the thermistor 14 are not influenced by the external temperature variations, the variation in the intermediate frequency signal can be minimized.

For example, in the case where the satellite communication transmitter is provided outdoors, the output intermediate frequency signal from the automatic gain control circuit of the present invention has a small variation of ±0.4dB or less based on the external temperature variation, whereas an output intermediate frequency signal from a conventional automatic gain control circuit has a large variation of ±2 dB or more based on the external temperature variation.

Provided that the reference signal 9 is fixed to a direct current (DC) voltage signal, the reference signal detector 8 and the associated mechanical device may be removed. In this case, the automatic gain control circuit is implemented using only the intermediate frequency signal detector 7 and the associated mechanical device.

Figure 9:
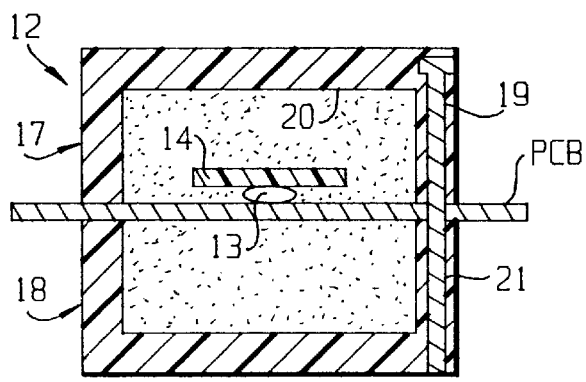
FIG. 9 is a sectional view of each of the mechanical devices in FIGS. 2 and 3.

FIG. 9 is a sectional view of each of the mechanical devices 12 in FIGS. 2 and 3. As shown in this drawing, the thermistor 14 is attached to the top surface of the Schottky diode 13 using the bond with the high thermal conductivity and the hot adhesiveness. In order to insulate the thermistor 14 from the outside, the thermistor recesses 20 of the upper and lower parts 17 and 18 of the mechanical device 12 are filled with the glass fiber. Then, the upper and lower parts 17 and 18 of the mechanical device 12 are screwed to the top and bottom surfaces of the printed circuit board through the screw holes 19 and 21.

As apparent from the above description, according to the present invention, the Schottky diodes, the differential integrator and the thermistors are used to maintain the level of the output intermediate frequency signal from the outdoor automatic gain control circuit constant regardless of the external temperature variation. Also, the simple mechanical devices are mounted on the top and bottom surfaces of the printed circuit board to maintain the temperatures of the corresponding detectors constant. Therefore, the present invention has the effect of significantly enhancing the system performance and reducing the cost.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An automatic gain control circuit for a satellite communication transmitter, comprising:

gain amplification means for amplifying an intermediate frequency signal from an output terminal of a modulator in said satellite communication transmitter;

distribution means for distributing the amplified intermediate frequency signal from said gain amplification means;

intermediate frequency signal detection means for detecting the intermediate frequency signal distributed by said distribution means;

reference signal detection means for detecting a reference signal from an indoor system controller, said reference signal being used to control a level of the intermediate frequency signal distributed by said distribution means; and differential integration means for offsetting variations in an output signal from said intermediate frequency signal detection means and in an output signal from said reference signal detection means based on external temperature variations with respect to each other and feeding the resultant signal back to said gain amplification means.

2. An automatic gain control circuit for a satellite communication transmitter, as set forth in claim 1, wherein each of said intermediate frequency signal detection means and said reference signal detection means includes:

a Schottky diode; and a thermistor integrated with said Schottky diode.

3. An automatic gain control circuit for a satellite communication transmitter, as set forth in claim 2, wherein each of said intermediate frequency signal detection means and said reference signal detection means further includes a mechanical device, said mechanical device having upper and lower parts mounted on the top and bottom surfaces of a printed circuit board, respectively, for enclosing said thermistor.

4. An automatic gain control circuit for a satellite communication transmitter, as set forth in claim 3, wherein said upper and lower parts of said mechanical device include their thermistor recesses for receiving said thermistor, said thermistor recesses being filled with an insulating material to insulate said thermistor from the outside.

5. An automatic gain control circuit for a satellite communication transmitter, as set forth in claim 3, wherein only said intermediate frequency signal detection means further includes a mechanical device when said reference signal from said indoor system controller is fixed to a direct current voltage signal, said mechanical device having upper and lower parts mounted on the top and bottom surfaces of a printed circuit board, respectively, for enclosing said thermistor.

* * * * *